Aug. 1, 1967 D. A. WHITE 3,334,249

DIODE-CAPACITOR GATE HAVING ADDITIONAL SHUNTING CAPACITOR REDUCING RECOVERY TIME

Filed March 5, 1965 2 Sheets-Sheet 1

INVENTOR.
DONALD A. WHITE
BY
Blair & Buckles
ATTORNEYS

INVENTOR.
DONALD A. WHITE
BY
Blair & Buckles
ATTORNEYS 3,334,249

DIODE-CAPACITOR GATE HAVING ADDITIONAL SHUNTING CAPACITOR REDUCING RECOVERY TIME

Donald A. White, Westminster, Mass., assignor to Digital Equipment Corporation, Maynard, Mass.

Filed Mar. 5, 1965, Ser. No. 437,526
9 Claims. (Cl. 307—88.5)

ABSTRACT OF THE DISCLOSURE

A diode-capacitor gate includes an additional diode connected across the capacitor. This largely prevents a reverse charge accumulation on the capacitor that otherwise occurs under some conditions of operation and it thereby permits faster overall operation of the gate by limiting the discharge time of the capacitor.

Furthermore, the control signals for a diode-capacitor gate may be applied at both the pulse-output and pulse-input ends thereof, thereby providing for logical control signal combinations not so easily accommodated otherwise.

This invention relates to an improved diode-capacitor gate circuit and to a gated flip-flop incorporating the gate circuit for control of its input signals. The gate circuit is of a type comprising a coupling capacitor through which a gated pulse passes on its way from an input terminal to an output terminal. In accordance with the invention, a diode is connected across this capacitor to reduce the charging time thereof under certain conditions, thereby speeding up operation of the circuit in such cases.

An object of the present invention is to provide an improved diode-capacitor gate circuit. More specifically, it is an object of the invention to provide a diode-capacitor gate circuit having a shorter maximum recovery time than prior circuits of the same type, so that after a change in the voltages applied thereto, the circuit is always ready for the next gating operation after a relatively short standard time interval.

Another object of the invention is to provide a diode-capacitor gating circuit which is provided with the above features without degradation of other characteristics.

A further object of the invention is to provide a circuit of the above type in which the enhanced characteristics are obtained without unduly increasing the cost of the circuit.

Another object of the invention is to provide an improved gated flip-flop circuit employing a diode-capacitor gate circuit to control its input signals.

The invention accordingly comprises the features of construction, combinations of elements, and arrangements of parts which will be exemplified in the constructions hereinafter set forth, and the scope of the invention will be indicated in the claims.

For a fuller understanding of the nature and objects of the invention, reference should be had to the following detailed description taken in connection with the accompanying drawings, in which.

Figure 1:
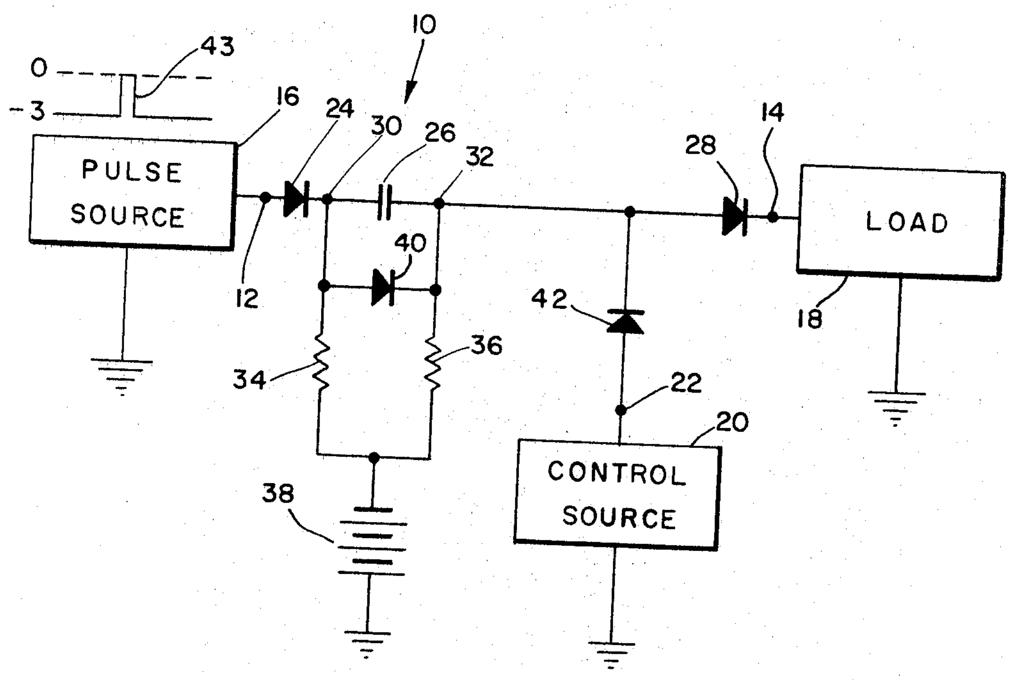
FIG. 1 is a schematic diagram of a gate circuit embodying the invention.

As shown in FIG. 1, a gate circuit generally indicated at 10 has input and output terminals 12 and 14 connected to a pulse source 16 and a load 18. The gate circuit either passes pulses from the source 16 to the load 18 or inhibits passage of such pulses, depending on the voltage level applied by a control source 20 to a control terminal 22.

The gate circuit 10 includes in its signal path the series combination of a diode 24, a capacitor 26 and a second diode 28. The illustrated circuit is arranged for the passage of positive-going pulses and therefore, the diodes 24 and 28 are connected as shown to pass such pulses. The capacitor 26 has terminals 30 and 32 to which resistors 34 and 36 are connected. The resistors in turn have their other ends connected to a bias source, illustratively a battery 38. A diode 40 is connected between the terminals 30 and 32. A further diode 42 is connected between the control terminal 22 and the capacitor terminal 32 as shown.

For the purpose of illustration, we will assume a system operating between voltage levels of −3 and 0 volts. Thus, the output voltage of the pulse source 16, as measured at the gate circuit input terminal 12, is normally −3 volts. It rises to 0 volts during the emission of a pulse, as indicated at 43 in the waveform shown above the pulse source 16 in FIG. 1. Similarly, the output level of the control source 20 is at either 0 or −3 volts, depending on whether or not the gate circuit 10 is to be enabled to pass pulses to the load 18.

The battery 38 supplies a negative potential substantially in excess of −3 volts, e.g., 12 volts. Moreover, the pulse source 16 and the control source 20 have internal resistances substantially lower than the resistances of the resistors 34 and 36. Therefore, by virtue of conduction through the diodes 24 and 42, the steady state voltages at the capacitor terminals 30 and 32 are essentially equal to the voltages supplied by the pulse source 16 and the control source 20, respectively, except for the voltage drops on the diodes 24 and 42.

The load 18 may be assumed to be a device which requires that the pulses at the gate circuit output terminal 14 reach 0 volts or even a slightly positive potential. Because of the voltage drop across the diode 28, this means that the pulses must have a somewhat positive voltage at the capacitor terminal 32, for example, 0.5 volt assuming a 0.5 volt potential drop across each forward-biased diode.

Operation of the circuit is as follows. First assume that the control level applied by the source 20 to the control terminal 22 is at −3 volts, so as to disable the gate circuit. The output voltage of the source 16 is also initially at this level. Therefore, assuming steady state conditions, both the terminals 30 and 32 of the capacitor 26 are at −3.5 volts, taking into consideration the voltage drops across the diodes 24 and 42. When the pulse 43 is emitted by the source 16, it is passed by the diode 24, with a reduction in its potential to −0.5 volt at the capacitor terminal 30. The leading edge of this pulse causes the potential at capacitor terminal 32 to rise by the same amount, i.e., 3 volts, and thus reach the same instantaneous value. With its negative voltage the pulse will be blocked by the diode 28, or if it is passed by the latter diode, with a slight reduction in voltage, it will fail to meet the requirement of the load 18. Thus, in effect, the gate circuit 10 inhibits the passage of the pulse 43 from the source 16 to the load 18.

Next consider the case where the gate is enabled by virtue of a 0-volt level at the control terminal 22. In this case the steady state potential at the capacitor terminal 32 is −0.5 volt. When the pulse 43 is emitted by the source 16, the potential of the capacitor terminal 30 again rises to −0.5 volt. However, the transfer of this 3-volt change in potential across the capacitor 26 to the terminal 32 causes the potential at the latter terminal to rise to +2.5 volts. With a peak of +2.5 volts, the pulse is passed by the diode 28 to the load 18 and it easily meets the load requirement specified above.

When the capacitor terminal 32 goes positive during the passage of a pulse from the source 16 to the load 18, the voltage relationship between the terminals 32 and 22 causes reverse biasing of the diode 42. This cuts off the diode and prevents dissipation of the pulse in the control source 20.

It should be noted that for a pulse from the source 16 to be passed to the load 18, the magnitude of the pulse at the capacitor terminal 30 must exceed the potential at the terminal 32 by a certain minimum amount. This is of importance when the voltage of the control source 20 is changed from its negative disabling level to the 0 volt enabling level. When such a change is made, a finite time interval elapses before the voltage across the capacitor 26 reaches a level permitting passage of a pulse from the source 16.

This will be readily understood by considering what happens in the circuit immediately following a change in the output voltage of the control source 20. In the first instance, assume that both the pulse source 16 and control source 20 have been at the −3-volt level for a sufficient period of time for the capacitor tterminals 30 and 32 to attain these steady state potentials. If the control voltage is suddenly shifted to the 0 volt enabling level, the potential at the terminal 32 will immediately rise 3 volts from −3.5 volts to −0.5 volt (assuming the 0.5 volt drop across the diode 42).

This sudden change will be reflected by an essentially equal rise in the voltage at the capacitor terminal 30 and the latter voltage will therefore momentarily increase to −0.5. If at this time the pulse source 16 emits a pulse, the voltage at the terrminal 12 will rise to 0. However, there will be essentially no change in the voltage at the capacitor terminal 30 and therefore, the pulse will not be transmitted through the capacitor 26. Over a period of time, largely determined by the voltage of the battery 38, the resistance of the resistor 34 and the capacitance of capacitor 26, the potential at the terminal 30 will drop to the point at which a pulse from the source 16 will cause a sufficient change in the terminal 30 potential for transmission of a pulse through to the load 18.

Next consider the case where the output voltage of the pulse source 16 is at 0 when the control level shifts from −3 volts to 0. This can occur quite often when the pulse source emits relatively long pulses. A source of this type might be a flip-flop which is cycled between its two stable states at a relatively slow rate. Since the capacitor terminal 30 is initially at −0.5 volt, the 3-volt change at the terminal 32 causes the potential at the terminal 30 to rise bye 3 volts to +2.5 volts.

With prior circuits a substantially longer time than in the previous example is then required before another positive-going pulse from the source 16 will be passed to the load 18. The reason for this is that the potential at the capacitor terminal 30 much change by a substantially greater amount to reach the level at which a pulse from a source 16 will change the terminal 30 voltage sufficiently to provide a positive pulse at the terminal 32.

The present invention eliminates this additional waiting period by means of the diode 40 connected between the terminals 30 and 32. This diode prevents the terminal 30 from going positive with respect to the terminal 32, except for the relatively small forward bias across the diode. Thus, the charging of the capacitor begins from the same point regardless of the potential of the source 16 at the time the control voltage is shifted from the disabling level to the enabling level.

Actually the diode 40 prevents the terminal 32 from going negative with respect to the terminal 30 when the source 16 has a positive output voltage, regardless of the fact that the source 20 may have been switched to its disabling level. If the pulse source 16 then reverts to its negative level, the potential at the terminal 30 will drop to that level. However, the potential at the terminal 32 will drop at the same rate. A positive-going pulse from the source 16 will therefore increase the potential at the terminal 32 momentarily to 0. As pointed out above, this is the potential that is reached by this terminal in reseponse to a pulse when the gate is disabled. Consequently, the pulse does not pass to the load 18.

Thus, in the case where the control source 20 is switched to the enabling level when the output potential of the pulse source 16 is at 0, with an immediately subsequent change in the pulse source voltage to −3, the diode 40 reduces the recovery time of the gate circuit 10 to the interval following other switching situations. Ordinarily, following changes in the voltages applied to the gate circuit, a system employing the circuit must in all cases wait for a period equal to the maximum recovery time before permitting the emission of the next pulse from the source 16. Therefore, in practice, the diode 40 provides faster operation in switching sequences. Moreover, this is accomplished without degrading other characteristics of the gate circuit.

Figure 2:
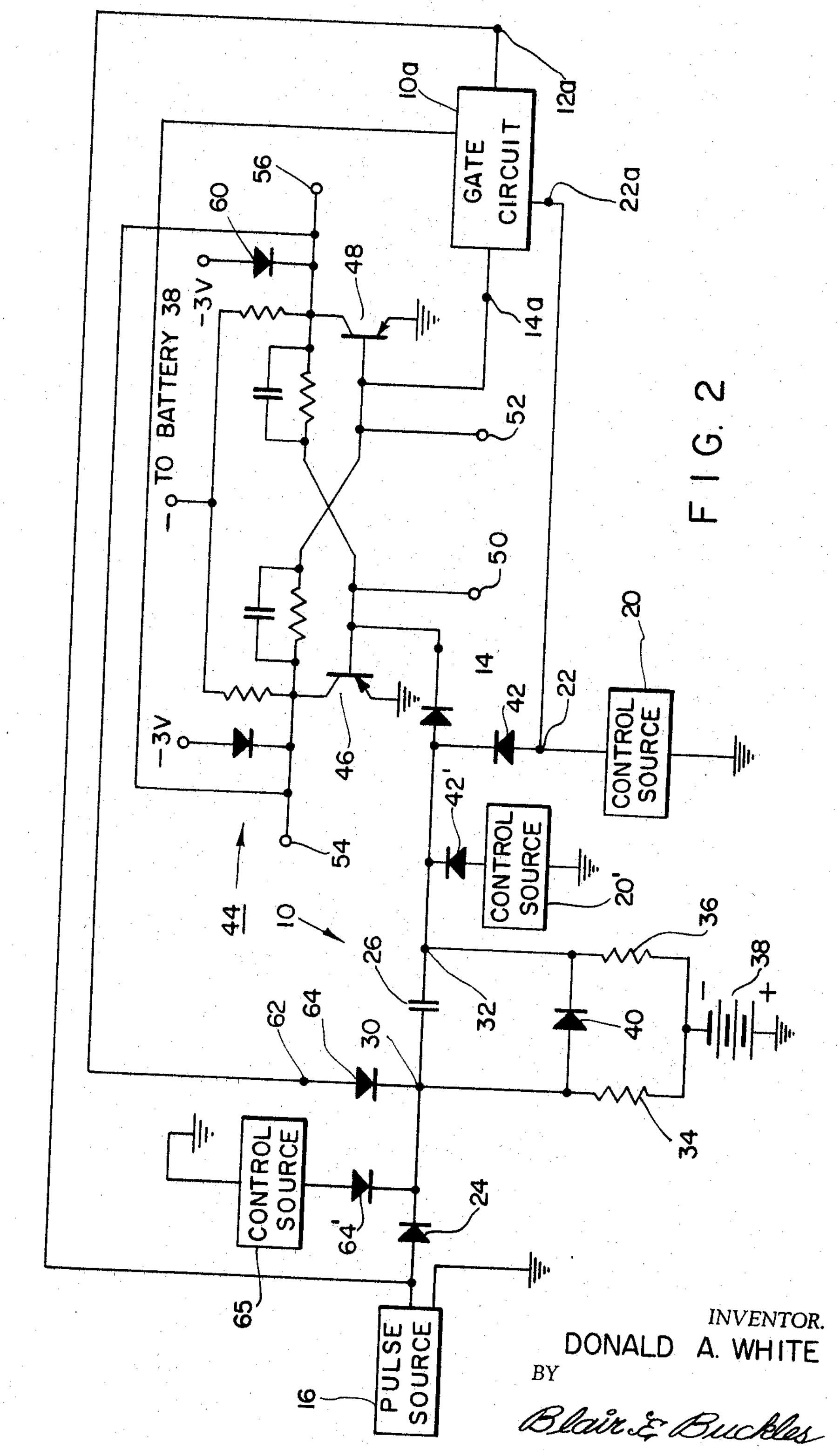
FIG. 2 is a schematic diagram of a gated flip-flop circuit incorporating the invention.

FIG. 2 is a circuit diagram illustrating a flip-flop, indicated generally at 44, receiving pulses from the pulse source 16 by way of gate circuits 10 and 10*a* constructed according to the invention. The flip-flop 44 comprises a pair of transistors 46 and 48 which may be connected in a conventional arrangement as shown. Input terminals 50 and 52 are connected to the respective bases of the transistors. A second pair of input terminals are the output terminals 14 and 14*a* of the gate circuits 10 and 10*a*. The flip-flop 44 also has a pair of output terminals 54 and 56 at the transistor collectors.

When one of the transistors 46 and 48 is conducting, its output terminal is at essentially zero volts with respect to ground. When a transistor is cut off, its collector is at −3 volts, by virtue of a clamping diode 58 or 60 connected to a three-volt power supply (not shown).

With further reference to FIG. 2, the flip-flop output terminal 56 is connected to a second control terminal 62 in the gate circuit 10. A diode 64 is connected between the terminal 62 and the terminal 30 of the capacitor 26. With this connection the output signal appearing at the terminal 56 of the flip-flop 44 operates to control the gate circuit 10.

More specifically, when the condition of the flip-flop 44 is such that the transistor 46 is conducting and the transistor 48 is cut off, the −3-volt level at the terminal 56 is the same as the level at the capacitor terminal 30 required for passage of a pulse from the source 16 through the gate circuit 10. A pulse from the pulse source will then cut off the transistor 46, thereby bringing about a change in the state of the flip-flop 44, with the terminal 56 going to approximately ground potential.

This brings the capacitor terminal 30 to ground. There can then be no change in the potential at the terminal 30 as a result of a pulse from the source 16 and therefore, pulses will not be transmitted through the capacitor 26. Accordingly, the potential at the control input 62 has the same effect as the potential at the control input 22, although with reverse effect. That is, 0- and −3-volt levels at the terminal 62 cause disabling and enabling respectively of the gate circuit 10, whereas at the terminal 22 the 0-volt level enables the gate circuit and the −3 level disables it as described above.

The advantage of using a control input coupled to the capacitor terminal 30 in the illustrated arrangement will be understood by considering what happens when one runs a second control source 20' in parallel with the control source 20, i.e., coupled to the capacitor terminal 32 by way of a diode 42' (FIG. 2). If either of these control sources is at the 0-volt level, the gate circuit 10 will be enabled regardless of the level of the other source. This follows from the fact that if the control terminal 22, for example, is brought to ground level, the potential at the capacitor terminal 32 will be at this level, even if other control sources such as 20' are set at −3 volts.

On the other hand, even when the control source 20 is at the enabling level, the presence of the ground level at the control terminal 62 will disable the gate circuit 10; it will also be apparent that if a number of control sources, such as the source 65 of FIG. 2, are connected to the capacitor terminal 30 in a manner similar to the control terminal 62, i.e., through the diode 64', the gate circuit 10 will be disabled wherever any one of these latter sources has a 0-volt output. Again, the reason for this is that if one of these sources is at the 0-volt level, the capacitor terminal 30 will be at approximately the same level regardless of the voltages of the others of these sources. The use of control input terminals coupled to the terminal 30 of the capacitor 26 thus provides logical functions which are obtained with sources coupled to the terminal 32 only if additional elements are connected into the system. Similarly, the control input terminals coupled to the terminal 32 provide logical functions not so readily obtained through use of control sources coupled to the terminal 30.

It will thus be seen that the objects set forth above, among those made apparent from the preceding description, are efficiently attained and, since certain changes may be made in the above constructions without departing from the scope of the invention, it is intended that all matter contained in the above description or shown in the accompanying drawing shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

I claim:

1. A diode-capacitor gate circuit comprising
(A) first and second diodes,
(B) a capacitor having first and second terminals,
(C) means connecting said capacitor between said diodes in a series path with said diodes conducting in the same direction along said path,
(D) a bias source having first and second terminals,
(E) potential dropping means connected between said first terminal of said source and said terminals of said capacitor,
(F) a third diode connected across said capacitor and arranged to conduct in the same direction as said first and second diodes with respect to said series path.

2. The combination defined in claim 1
(A) including a fourth diode and means connecting a terminal of said fourth diode to the terminal of said capacitor connected to said second diode, and
(B) in which said fourth diode is connected to conduct in the same direction as said second diode in the series circuit including said second and fourth diodes.

3. The combination defined in claim 2
(A) including a fifth diode and means connecting said fifth diode to the terminal of said capacitor connected to said first diode, and
(B) in which said fifth diode is connected to conduct in the direction opposite to that of said first diode in a series circuit including said first and fifth diodes.

4. The combination defined in claim 3
(A) including a sixth diode and means connecting said sixth diode to the terminal of said capacitor connected to said first diode, and
(B) in which said sixth diode is connected to conduct in the direction opposite to that of said first diode in a series circuit including said first and sixth diodes.

5. A diode-capacitor gate circuit comprising
(A) first and second diodes,
(B) a capacitor having first and second terminals,
(C) a bias source having first and second terminals,
(D) potential dropping elements connected between said first terminal of said bias source and said terminals of said capacitor,
(E) a pulse source connected between said first diode and said second terminal of said bias source,
(F) a load connected between said second diode and said second terminal of said bias source,
(G) means connecting said first diode to said first capacitor terminal and said second diode to said second capacitor terminal, whereby said capacitor is in series with said diodes between said pulse source and said load with said first and second diodes being connected to conduct pulses from source to said load,
(H) the polarity of said bias source being such as to apply a forward bias to said first diode,
(I) a control source connected between said second bias terminal and the capacitor terminal connected to said second diode, and
(J) a third diode connected between said first and second capacitor terminals, the direction of conduction of said third diode with respect to the series path comprising said first and second diodes and said capacitor being the same as that of said first and second diodes.

6. The combination defined in claim 5 including a diode connected between said control source and said second capacitor terminal, the direction of conduction of said fourth diode being the same as that of said second diode in the series circuit including said second and fourth diodes.

7. The combination defined in claim 5 including
(A) a second control source having first and second terminals,
(B) means connecting said first terminal of said second control source to said second terminal of said bias source,
(C) a fifth diode connected between said second terminal of said second control source and said first terminal of said capacitor, the direction of conduction of said fifth diode in the series circuit including said fifth diode and said first diode being opposite to that of said first diode.

8. The combination defined in claim 7 including
(A) a third control source having first and second terminals,
(B) means connecting said first terminal of said third control source to said second terminal of said bias source,
(C) a sixth diode connected between said second terminal of said third control source and said first terminal of said capacitor, the direction of conduction of said sixth diode in the series circuit including said sixth diode and said first diode being opposite to that of said first diode.

9. A diode-capacitor gate circuit comprising
(A) first and second diodes,
(B) a capacitor having first and second terminals,
(C) a bias source having first and second terminals,
(D) potential dropping elements connected between said first terminal of said bias source and said terminals of said capacitor,
(E) a pulse source connected between said first diode and said second terminal of said bias source,
(F) a load connected between said second diode and said second terminal of said bias source, (G) means connecting said capacitor between said first and second diodes and in series with said diodes between said pulse source and said load, with said first and second diodes being connected to conduct pulses from source to said load, (H) the polarity of said bias source being such as to apply a forward bias to said first diode, (I) a first control source connected between said second bias terminal and the capacitor terminal connected to said second diode, (J) a second control source having first and second terminals, (1) means connecting said first terminal of said second control source to said second terminal of said bias source, (2) a third diode connected between said second terminal of said second control source and the capacitor terminal connected to said first diode, the direction of conduction of said fifth diode in the series circuit including said fifth diode and said first diode being opposite to that of said first diode.

References Cited

UNITED STATES PATENTS

| | | | |
|---|---|---|---|
| 2,812,451 | 11/1957 | Curtis | 307—88.5 |
| 2,946,901 | 7/1960 | Kyler | 307—88.5 |

ARTHUR GAUSS, *Primary Examiner.*

B. P. DAVIS, *Assistant Examiner.*